US012628658B2

(12) United States Patent
Lee et al.

(10) Patent No.: US 12,628,658 B2
(45) Date of Patent: May 12, 2026

(54) SEMICONDUCTOR PACKAGE AND METHOD OF FABRICATING THE SAME

(71) Applicant: Samsung Electronics Co., Ltd., Suwon-si (KR)

(72) Inventors: Jinon Lee, Asan-si (KR); Wookeun Han, Asan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 813 days.

(21) Appl. No.: 17/981,535

(22) Filed: Nov. 7, 2022

(65) Prior Publication Data

US 2023/0223350 A1      Jul. 13, 2023

(30) Foreign Application Priority Data

Jan. 13, 2022      (KR) ........................ 10-2022-0005332

(51) Int. Cl.
| | |
|---|---|
| *H01L 23/544* | (2006.01) |
| *H01L 23/00* | (2006.01) |
| *H01L 25/00* | (2006.01) |
| *H01L 25/18* | (2023.01) |

(52) U.S. Cl.
CPC ............ *H01L 23/544* (2013.01); *H01L 24/16* (2013.01); *H01L 24/32* (2013.01); *H01L 24/73* (2013.01); *H01L 24/92* (2013.01); *H01L 25/18* (2013.01); *H01L 25/50* (2013.01); *H01L 2223/54426* (2013.01); *H01L 2224/16145* (2013.01);

(Continued)

(58) Field of Classification Search
CPC ........ H01L 23/544; H01L 24/16; H01L 24/32
See application file for complete search history.

(56) References Cited

U.S. PATENT DOCUMENTS

| | | | |
|---|---|---|---|
| 7,521,810 B2 * | 4/2009 | Kang | ...................... H01L 23/12 |
| | | | 257/E23.021 |
| 8,651,359 B2 | 2/2014 | Gaynes et al. | |
| 10,497,691 B2 | 12/2019 | Shin et al. | |

(Continued)

FOREIGN PATENT DOCUMENTS

| | | |
|---|---|---|
| KR | 1020190136459 A | 12/2019 |
| KR | 1020210051535 A | 5/2021 |

(Continued)

*Primary Examiner* — Errol V Fernandes
(74) *Attorney, Agent, or Firm* — Muir Patent Law, PLLC

(57) ABSTRACT

A semiconductor package includes a first semiconductor chip, a second semiconductor chip on the first semiconductor chip, a plurality of chip connection bumps between the first semiconductor chip and the second semiconductor chip, a protective insulating layer between the first semiconductor chip and the second semiconductor chip, the protective insulating layer contacting the plurality of chip connection bumps, and a first dummy conductive structure at a bottom surface of the second semiconductor chip. When viewed in a plan view, the first dummy conductive structure surrounds an outer boundary of a region where the plurality of chip connection bumps are disposed. The bottom surface of the second semiconductor chip faces the first semiconductor chip. The first dummy conductive structure includes a plurality of dummy patterns separated from each other, and the plurality of dummy patterns are arranged along an edge of the second semiconductor chip.

18 Claims, 17 Drawing Sheets

(52) U.S. Cl.

CPC ............... *H01L 2224/32145* (2013.01); *H01L 2224/73204* (2013.01); *H01L 2224/9211* (2013.01)

(56)     References Cited

U.S. PATENT DOCUMENTS

| | | | | |
|---|---|---|---|---|
| 10,825,795 | B2 | 11/2020 | Kim | |
| 10,978,420 | B2 | 4/2021 | Hagiwara et al. | |
| 11,935,873 | B2 * | 3/2024 | Jun | ..................... H01L 25/0657 |
| 2011/0291246 | A1 * | 12/2011 | Jo | ........................... H01L 24/81 |
| | | | | 257/621 |
| 2013/0250298 | A1 * | 9/2013 | Komuta | ............... G01B 11/272 |
| | | | | 356/400 |
| 2016/0064357 | A1 * | 3/2016 | Choe | ........................ H01L 24/06 |
| | | | | 438/109 |
| 2016/0079208 | A1 * | 3/2016 | Heo | ................... H01L 23/3677 |
| | | | | 257/737 |
| 2016/0358892 | A1 * | 12/2016 | Lee | ........................ H01L 21/563 |
| 2021/0098415 | A1 | 4/2021 | Lee et al. | |
| 2021/0111040 | A1 | 4/2021 | Tokumiya et al. | |

FOREIGN PATENT DOCUMENTS

| | | | |
|---|---|---|---|
| KR | 1020210122000 | A | 10/2021 |
| KR | 1020210135052 | A | 11/2021 |
| WO | 2012073417 | A1 | 6/2012 |

* cited by examiner

100

R4        IS-1        140        R3        R4

OS-1

Y

Z        X

S110

S120

SEMICONDUCTOR PACKAGE AND METHOD OF FABRICATING THE SAME

CROSS-REFERENCE TO RELATED APPLICATION

This application is based on and claims priority under 35 U.S.C. § 119 to Korean Patent Application No. 10-2022-0005332, filed on Jan. 13, 2022, in the Korean Intellectual Property Office, the disclosure of which is incorporated by reference herein in its entirety.

BACKGROUND

The inventive concept relates to a semiconductor package and a method of fabricating the same, and more particularly, to a semiconductor package in which a plurality of semiconductor chips are stacked and a method of fabricating the semiconductor package.

A semiconductor package is formed by performing a packaging process on semiconductor chips formed by performing various semiconductor processes on a wafer. A semiconductor package may include a semiconductor chip, a semiconductor package substrate on which the semiconductor chip is mounted, a chip connection bump electrically connecting the semiconductor chip to the semiconductor package substrate, and a protective insulating layer contacting the chip connection bump. With the high integration density of semiconductor packages, the reliability and the process capability of semiconductor packages need to be increased.

SUMMARY

The inventive concept provides a semiconductor package having increased reliability and a method of fabricating the same.

According to an aspect of the inventive concept, a semiconductor package includes a first semiconductor chip, a second semiconductor chip on the first semiconductor chip, a plurality of chip connection bumps between the first semiconductor chip and the second semiconductor chip, a protective insulating layer between the first semiconductor chip and the second semiconductor chip, the protective insulating layer contacting the plurality of chip connection bumps, and a first dummy conductive structure at a bottom surface of the second semiconductor chip. When viewed in a plan view, the first dummy conductive structure surrounds an outer boundary of a region where the plurality of chip connection bumps are disposed. The bottom surface of the second semiconductor chip faces the first semiconductor chip. The first dummy conductive structure includes a plurality of dummy patterns separated from each other, and the plurality of dummy patterns are arranged along an edge of the second semiconductor chip.

According to an aspect of the inventive concept, a semiconductor package includes a semiconductor package substrate, a first semiconductor chip on the semiconductor package substrate, a plurality of second semiconductor chips stacked on the first semiconductor chip, a plurality of first chip connection bumps between the semiconductor package substrate and the first semiconductor chip, a plurality of second chip connection bumps between the first semiconductor chip and a bottommost second semiconductor chip of the plurality of second semiconductor chips or between two adjacent second semiconductor chips of the plurality of second semiconductor chips, a protective insulating layer between the semiconductor package substrate and the first semiconductor chip, the first semiconductor chip and the bottommost second semiconductor chip, or between the two adjacent second semiconductor chips, the protective insulating layer contacting the plurality of first chip connection bumps or the plurality of second chip connection bumps, and a first dummy conductive structure at a bottom surface of each second semiconductor chip of the plurality of second semiconductor chips. When viewed in a plan view, the first dummy conductive structure surrounds an outer boundary of a region where the plurality of second chip connection bumps are disposed. The bottom surface of each second semiconductor chip of the plurality of second semiconductor chips faces the first semiconductor chip. The first dummy conductive structure includes a plurality of first dummy patterns arranged along an edge of each second semiconductor chip of the plurality of second semiconductor chips. The plurality of first dummy patterns are separated from each other.

According to an aspect of the inventive concept, a method of fabricating a semiconductor package includes arranging a plurality of chip connection bumps on a bottom surface of a second semiconductor chip, the second semiconductor chip including a top surface and the bottom surface, forming a dummy conductive structure at the bottom surface of the second semiconductor chip, forming a protective insulating layer on the bottom surface of the second semiconductor chip, the protective insulating layer adhering to the plurality of chip connection bumps, and stacking the second semiconductor chip on a first semiconductor chip, the first semiconductor chip facing the bottom surface of the second semiconductor chip. The bottom surface of the second semiconductor chip includes, when viewed in a plan view, an inner bottom surface that the plurality of chip connection bumps contact, and an outer bottom surface surrounding the inner bottom surface. The dummy conductive structure is at the outer bottom surface of the bottom surface of the second semiconductor chip. The dummy conductive structure includes a plurality of dummy patterns separated from each other. The plurality of dummy patterns are arranged along an edge of the bottom surface of the second semiconductor chip.

BRIEF DESCRIPTION OF THE DRAWINGS

Embodiments of the inventive concept will be more clearly understood from the following detailed description taken in conjunction with the accompanying drawings in which:

FIGS. 2 to 6A are cross-sectional views of semiconductor packages according to embodiments.

DETAILED DESCRIPTION OF THE EMBODIMENTS

Figure 1A:
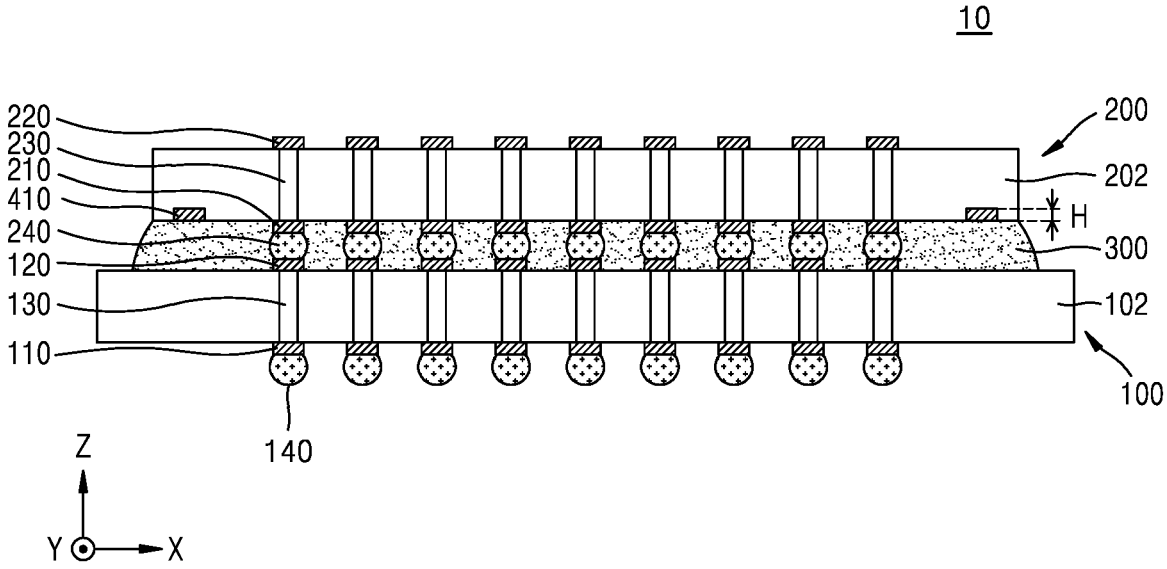
FIG. 1A is a cross-sectional view of a semiconductor package according to an embodiment.

Hereinafter, embodiments will be described in detail with reference to the accompanying drawings. In the drawings, like reference characters denote like elements, and redundant descriptions thereof will be omitted.

Figure 1B:
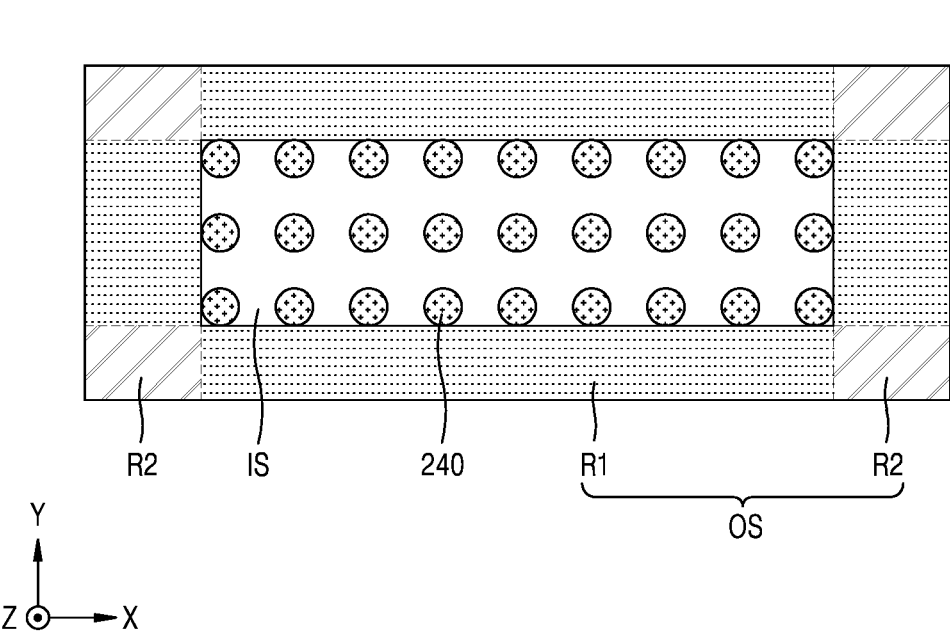
FIGS. 1B and 1C are bottom views of a second semiconductor chip according to an embodiment.
Figure 1C:
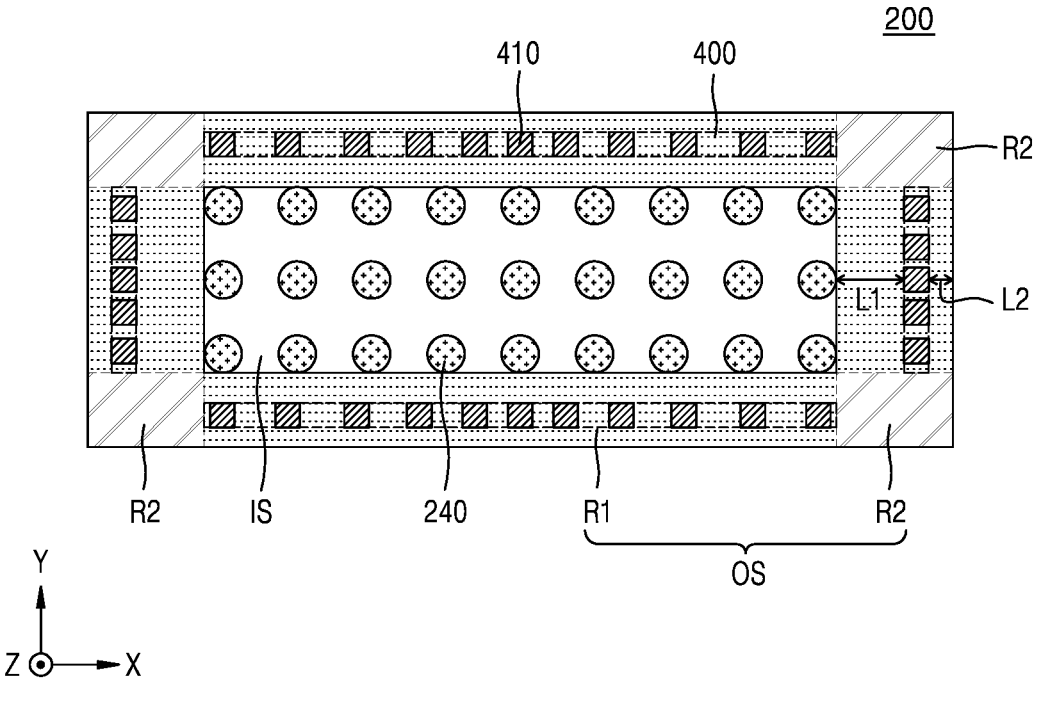
Figure 1D:
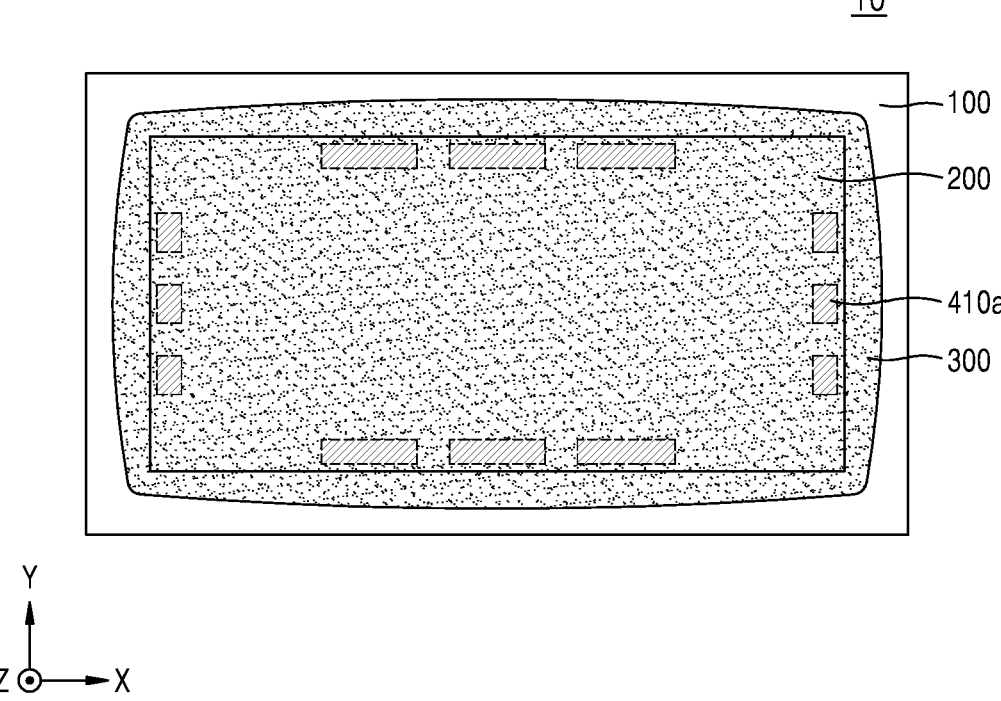
FIG. 1D is a top view of the semiconductor package of FIG. 1A.

FIG. 1A is a cross-sectional view of a semiconductor package 10 according to an embodiment. FIGS. 1B and 1C are bottom views of a second semiconductor chip 200 of the semiconductor package 10 of FIG. 1. FIG. 1D is a top view of the semiconductor package 10 of FIG. 1A. FIG. 1B is a bottom view of the second semiconductor chip 200, and FIG. 1C illustrates a conductive structure 400 at the bottom surface of the second semiconductor chip 200.

Referring to FIGS. 1A to 1D, the semiconductor package 10 may include a first semiconductor chip 100, the second semiconductor chip 200, a protective insulating layer 300, and the conductive structure 400. It is illustrated in the semiconductor package 10 that a horizontal width of the first semiconductor chip 100 is greater than a horizontal width of the second semiconductor chip 200. The present invention is not limited thereto. In an embodiment, a horizontal width of the first semiconductor chip 100 may be equal to or smaller than a horizontal width of the second semiconductor chip 200.

The first semiconductor chip 100 may include a first substrate 102, a plurality of first bottom connection pads 110, a plurality of first top connection pads 120, and a plurality of first through electrodes 130. A plurality of first chip connection bumps 140 may be at the bottom surface of the first semiconductor chip 100. The second semiconductor chip 200 may include a second substrate 202, a plurality of second bottom connection pads 210, a plurality of second top connection pads 220, and a plurality of second through electrodes 230. A plurality of second chip connection bumps 240 may be at the bottom surface of the second semiconductor chip 200.

The first and second substrates 102 and 202 may include or may be formed of silicon (Si). In an embodiment, the first and second substrates 102 and 202 may include or may be formed of a semiconductor element, e.g., germanium (Ge), or a compound semiconductor such as silicon carbide (SiC), gallium arsenide (GaAs), indium arsenide (InAs), and indium phosphide (InP). Each of the first and second substrates 102 and 202 may have an active surface and an inactive surface opposite to the active surface. According to an embodiment, the active surface may be referred to as a bottom surface, and the inactive surface may be referred to as a top surface.

Each of the first and second substrates 102 and 202 may include various types of individual devices in the active surface. The individual devices may include various microelectronic devices, e.g., a metal-oxide-semiconductor field effect transistor (MOSFET), such as complementary metal-oxide-semiconductor (CMOS) transistor, a system large scale integration (LSI), an image sensor, such as a CMOS image sensor (CIS), a micro-electro-mechanical system (MEMS), an active element, and/or a passive element.

The first and second semiconductor chips 100 and 200 may respectively include a first semiconductor device and a second semiconductor device, each including the individual devices. The first semiconductor device may be formed in the active surface of the first substrate 102. The first bottom connection pads 110 may be at the active surface of the first substrate 102. The first top connection pads 120 may be at the inactive surface of the first substrate 102. The second semiconductor device may be formed in the active surface of the second substrate 202. The second bottom connection pads 210 may be at the active surface of the second substrate 202. The second top connection pads 220 may be at the inactive surface of the second substrate 202.

The first through electrodes 130 may include or may be a through silicon via (TSV) that passes through the first substrate 102. The second through electrodes 230 may include or may be a TSV that passes through the second substrate 202. The first through electrode 130 may be inside the first substrate 102 and may connect the first bottom connection pad 110 to the first top connection pad 120, thereby transmitting an electrical signal. The second through electrode 120 may be inside the second substrate 202 and may connect the second bottom connection pad 210 to the second top connection pad 220, thereby transmitting an electrical signal to another semiconductor chip stacked on the second semiconductor chip 200.

The first chip connection bumps 140 may be attached to the first bottom connection pads 110 of the first semiconductor chip 100. The first chip connection bumps 140 may be between the first bottom connection pads 110 of the first semiconductor chip 100 and a semiconductor package substrate 500 (see FIG. 5) and electrically connect the semiconductor package substrate 500 to the first semiconductor chip 100.

The second chip connection bumps 240 may be attached to the second bottom connection pads 210 of the second semiconductor chip 200. The second chip connection bumps 240 may be between the first top connection pads 120 of the first semiconductor chip 100 and the second bottom connection pads 210 of the second semiconductor chip 200 and electrically connect the first semiconductor chip 100 to the second semiconductor chip 200. As a result, the first semiconductor chip 100 may be electrically connected to the second semiconductor chip 200.

After an under bump metallization (UBM) layer is formed on the first bottom connection pads 110 via vacuum plating or electroplating, the first chip connection bumps 140 may be attached to the first bottom connection pads 110. After a UBM layer is formed on the second bottom connection pads 210 via vacuum plating or electroplating, the second chip connection bumps 240 may be attached to the second bottom connection pads 210.

The bottom surface of the second semiconductor chip 200 may be divided into an inner space (i.e., an inner bottom surface) IS and an outer space (i.e., an outer bottom surface) OS by the second chip connection bumps 240. The inner space IS may be in contact with the second chip connection bumps 240. For example, the inner space IS may include a quadrangular region overlapping all of the second chip connection bumps 240, as shown in FIG. 1B. The outer space OS may surround the inner space IS in a plan view. For example, a region where the second chip connection bumps 240 are positioned may be referred to as the inner space IS, and the outside region of the inner space IS may be referred to as the outer space OS. A straight line contacting outermost second chip connection bumps of the second chip connection bumps 240 may be a boundary between the inner space IS and the outer space OS. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact. As used herein, components described as being "electrically connected" are configured such that an electrical signal can be transferred from one component to the other (although such electrical signal may be attenuated in strength as it transferred and may be selectively transferred).

The protective insulating layer 300 may be in contact with the second chip connection bumps 240. In an embodiment, the protective insulating layer 300 may surround the side walls of the second chip connection bumps 240. In an embodiment, the protective insulating layer 300 may be between the first semiconductor chip 100 and the second semiconductor chip 200. The protective insulating layer 300 may fill a space between the first semiconductor chip 100 and the second semiconductor chip 200. The top surface of the protective insulating layer 300 may be at substantially the same vertical level as (i.e., may be coplanar with) the bottom surface of the second semiconductor chip 200, and the bottom surface of the protective insulating layer 300 may be at substantially the same vertical level as (i.e., may be coplanar with) the top surface of the first semiconductor chip 100. For example, the protective insulating layer 300 may include or may be a non-conductive film (NCF) and/or a die attach film (DAF). Terms such as "same," "equal," "planar," or "coplanar," as used herein encompass near identicality including variations that may occur, for example, due to manufacturing processes. The term "substantially" may be used herein to emphasize this meaning, unless the context or other statements indicate otherwise.

The conductive structure 400 may be at the bottom surface of the second semiconductor chip 200 and extend along an edge of the bottom surface of the second semicon-ductor chip 200. For example, the conductive structure 400 may linearly extend along at least one edge of the bottom surface of the second semiconductor chip 200. The conduc-tive structure 400 may include a plurality of sub patterns (i.e., a plurality of patterns or a plurality of dummy patterns) 410, which are separated from each other. In this case, the conductive structure 400 may linearly extend along at least one edge of the bottom surface of the second semiconductor chip 200 and have a line shape that discretely extends. For example, the plurality of sub patterns that are separated from each other may be arranged along the edge of the bottom surface of the second semiconductor chip 200 except for corner regions thereof. The sub patterns 410 may not be electrically connected to the second bottom connection pads 210, the second through electrodes 230, and/or the second chip connection bumps 240. In other words, the sub patterns 410 may correspond to dummy connection pads or dummy patterns. In example embodiments, the sub patterns 410 may be formed simultaneously with the second bottom connec-tion pads 210. In an embodiment, the sub patterns 410 may be formed using a different process than a process of forming the second bottom connection pads 210. As used herein, the term "dummy" is used to refer to a component that has the same or similar structure and shape as other components but does not have a substantial function and exists only as a pattern in the device. In an embodiment, the sub patterns 410 as dummy connection pads may be elec-trically floating.

According to an embodiment, the top surface of the conductive structure 400 and/or the top surfaces of the sub patterns 410 may be at a higher vertical level than the bottommost surface of the second semiconductor chip 200 and/or the top surface of the protective insulating layer 300. The bottom surface of the conductive structure 400 and/or the bottom surface of the sub patterns 410 may be at substantially the same vertical level as (i.e., may be coplanar with) the bottommost surface of the second semiconductor chip 200 and/or the topmost surface of the protective insu-lating layer 300.

The conductive structure 400 may be only in the outer space OS. In other words, the conductive structure 400 may be between the inner space IS of the bottom surface of the second semiconductor chip 200 and an edge of the bottom surface of the second semiconductor chip 200. For example, when viewed in a plan view, the conductive structure 400 may be disposed outside a connecting region where the second chip connection bumps 240 are disposed, and the sub patterns 410 may be arranged along an outer boundary of the connecting region.

The outer space OS may be divided into a first region R1 and a second region R2. The first region R1 may be adjacent to the center of an edge of the bottom surface of the second semiconductor chip 200, and the second region R2 may be adjacent to a vertex of the second semiconductor chip 200. The vertex may be a point at which two adjacent edges of the bottom surface of the second semiconductor chip 200 meet each other. For example, the first region R1 may include about 60% to about 90% of an edge of the bottom surface of the second semiconductor chip 200 but is not limited thereto.

In an example embodiment, a distance L1 from the conductive structure 400 to the inner space IS may be greater than a distance L2 from the conductive structure 400 to an edge of the bottom surface of the second semiconductor chip 200, which is the nearest from the conductive structure 400 in a direction perpendicular to an extension direction of the long axis of the conductive structure 400. For example, the distance L1 from the conductive structure 400 to the inner space IS may be between about 5 micrometers and about 45 micrometers. For example, a distance from the inner space IS to an edge of the second semiconductor chip 200 may be between about 50 micrometers and about 90 micrometers. A height H of the conductive structure 400 and/or the sub patterns 410 may be between about 3 micrometers and about 15 micrometers. Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

In a plan view, the sub patterns 410 may be separated from one another in a first horizontal direction (an X direction) and/or a second horizontal direction (a Y direction). The first horizontal direction (the X direction) and/or the second horizontal direction (the Y direction) may be parallel with the bottom surface of the second semiconductor chip 200. A vertical direction (a Z direction) may be parallel with an extension direction of the first and/or second through elec-trodes 130 and/or 230. A horizontal distance between the sub patterns 410 may increase toward the second region R2. In other words, a gap between the sub patterns 410 of the conductive structure 400 may decrease toward the center of an edge of the second semiconductor chip 200 and increase toward a vertex of the second semiconductor chip 200. The width and/or length of the sub patterns 410 may be between about 25 micrometers and about 45 micrometers.

Although it is illustrated in FIG. 1C that the horizontal cross-section of the sub patterns 410 is square, the present invention is not limited thereto. In an embodiment, the horizontal cross-section of the sub patterns 410 may be rectangular, circular, oval, polygonal, and/or of an atypical form in a plan view. FIG. 1D shows the case where the horizontal cross-section of a sub pattern 410a is rectangular. In an embodiment, the sub patterns 410 may include a plurality of first patterns that are arranged along a first edge of the second semiconductor chip 200 extending in the X direction, and a plurality of second patterns that are arranged along a second edge of the second semiconductor chip 200 extending in the Y direction. A horizontal distance between two adjacent first patterns of the plurality first patterns may increase toward the second edge of the second semiconductor chip 200.

Figure 2:
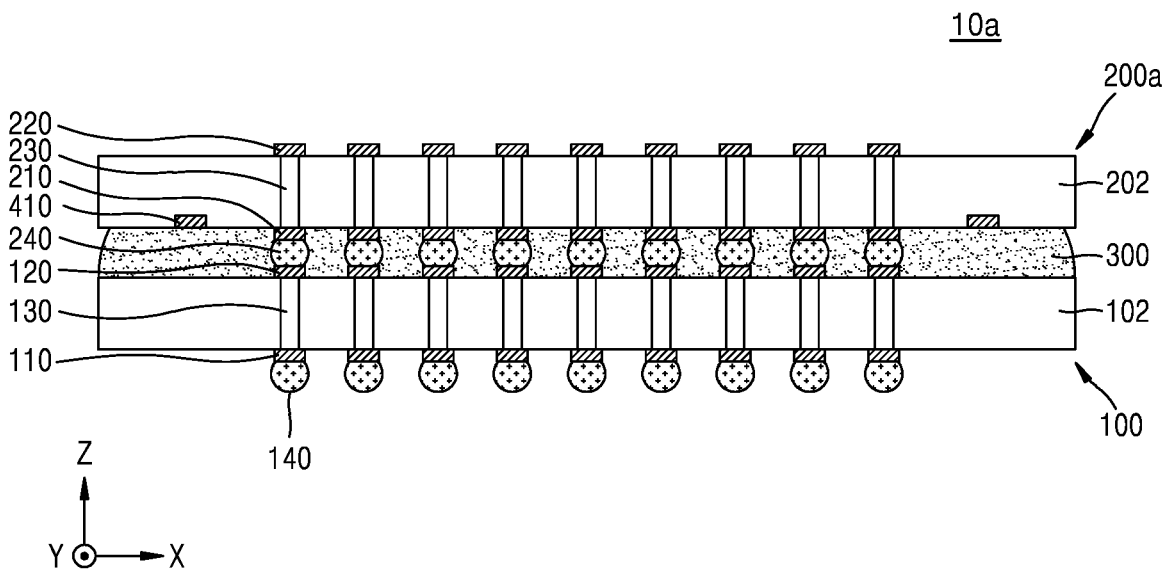

FIG. 2 is a cross-sectional view of a semiconductor package 10*a* according to an embodiment.

Referring to FIG. 2, the semiconductor package 10*a* may include the first semiconductor chip 100, a second semiconductor chip 200*a*, the protective insulating layer 300, and the conductive structure 400. The first semiconductor chip 100, the protective insulating layer 300, and the conductive structure 400 in FIG. 2 may be substantially the same as those of the semiconductor package 10 of FIG. 1A. Therefore, only the second semiconductor chip 200*a* is described below.

A horizontal width of the second semiconductor chip 200*a* may be substantially the same as a horizontal width of the first semiconductor chip 100. This is just an example, and the horizontal width of the second semiconductor chip 200*a* may be greater than the horizontal width of the first semiconductor chip 100. In this case, the conductive structure 400 may still be only in the outer space OS of the second semiconductor chip 200*a* in a plan view.

Figure 3:
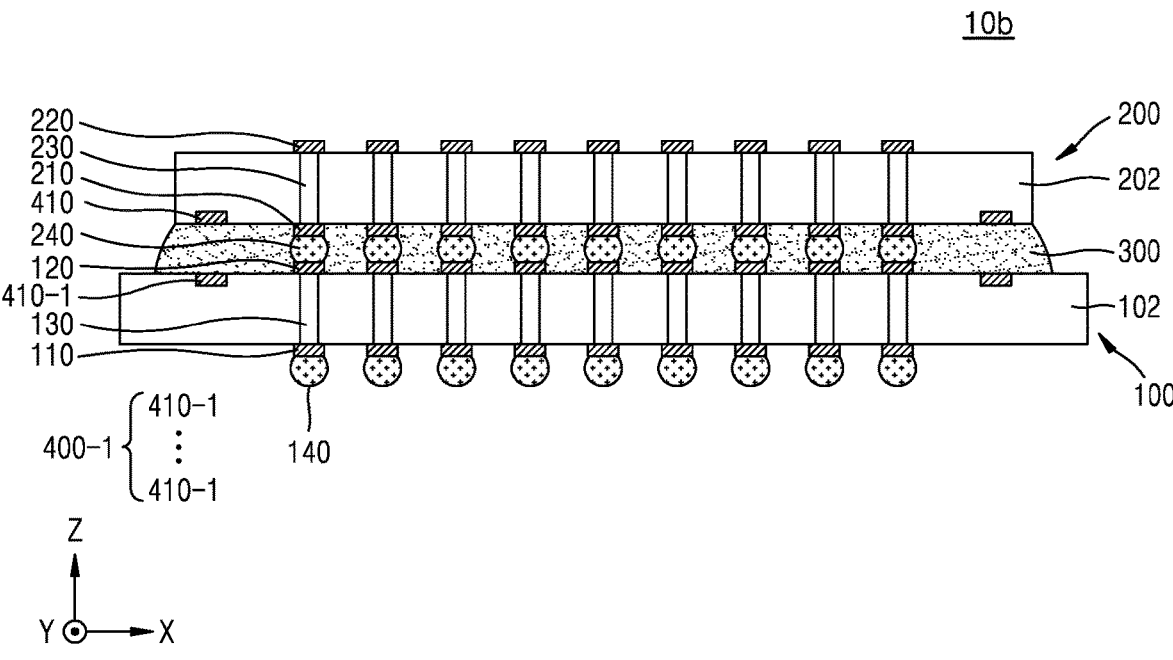

FIG. 3 is a cross-sectional view of a semiconductor package 10*b* according to an embodiment.

Referring to FIG. 3, the semiconductor package 10*b* may include the first semiconductor chip 100, the second semiconductor chip 200, the protective insulating layer 300, the conductive structure 400, and an auxiliary conductive structure 400-1. The first semiconductor chip 100, the second semiconductor chip 200, the protective insulating layer 300, and the conductive structure 400 in FIG. 3 may be substantially the same as those of the semiconductor package 10 of FIG. 1A. Therefore, only the auxiliary conductive structure 400-1 is described below.

The auxiliary conductive structure 400-1 may be arranged to be adjacent to the top surface of the first semiconductor chip 100. The auxiliary conductive structure 400-1 may include a plurality of auxiliary sub patterns 410-1. The auxiliary sub patterns 410-1 may include substantially the same material as the sub patterns 410. The auxiliary sub patterns 410-1 may not be electrically connected to the first top connection pads 120, the first through electrodes 130, and/or the second chip connection bumps 240. According to an embodiment, the conductive structure 400 may be aligned with the auxiliary conductive structure 400-1 in the vertical direction (the Z direction). Each of the sub patterns 410 may be aligned with a corresponding one of the auxiliary sub patterns 410-1 in the vertical direction (the Z direction). For example, each of the sub patterns 410 may overlap a corresponding auxiliary sub pattern of the auxiliary sub patterns 410 in the vertical direction.

The top surface of the auxiliary conductive structure 400-1 and/or the top surface of each of the auxiliary sub patterns 410-1 may be at substantially the same vertical level as (i.e., may be coplanar with) the topmost surface of the first semiconductor chip 100 and/or the bottommost surface of the protective insulating layer 300. The bottom surface of the auxiliary conductive structure 400-1 and/or the bottom surface of each of the auxiliary sub patterns 410-1 may be at a lower vertical level than the topmost surface of the first semiconductor chip 100 and/or the bottommost surface of the protective insulating layer 300.

According to an embodiment, the top surface of the auxiliary conductive structure 400-1 and/or the top surface of each of the auxiliary sub patterns 410-1 may be at a higher vertical level than the topmost surface of the first semiconductor chip 100 and/or the bottommost surface of the protective insulating layer 300. The bottom surface of the auxiliary conductive structure 400-1 and/or the bottom surface of each of the auxiliary sub patterns 410-1 may be at substantially the same vertical level as (i.e., may be coplanar with) the topmost surface of the first semiconductor chip 100 and/or the bottommost surface of the protective insulating layer 300.

In a plan view, the auxiliary sub patterns 410-1 may be arranged only in the outer space OS. In a plan view, the auxiliary sub patterns 410-1 may be separated from one another in the first horizontal direction (the X direction) and/or the second horizontal direction (the Y direction). A horizontal distance between the auxiliary sub patterns 410-1 may increase toward the second region R2. In other words, a gap between the auxiliary sub patterns 410-1 of the auxiliary conductive structure 400-1 may decrease toward the center of an edge of the second semiconductor chip 200 and increase toward a vertex of the second semiconductor chip 200. In an embodiment, the auxiliary sub patterns 410-1 may include a plurality of first patterns that are arranged along a first edge of the first semiconductor chip 100 extending in the X direction, and a plurality of second patterns that are arranged along a second edge of the first semiconductor chip 100 extending in the Y direction. A horizontal distance between two adjacent first patterns of the plurality first patterns may increase toward the second edge of the first semiconductor chip 100.

Although it is illustrated in FIG. 3 that the horizontal width of the first semiconductor chip 100 is greater than the horizontal width of the second semiconductor chip 200, the horizontal width of the first semiconductor chip 100 may be less than or equal to the horizontal width of the second semiconductor chip 200.

Figure 4:
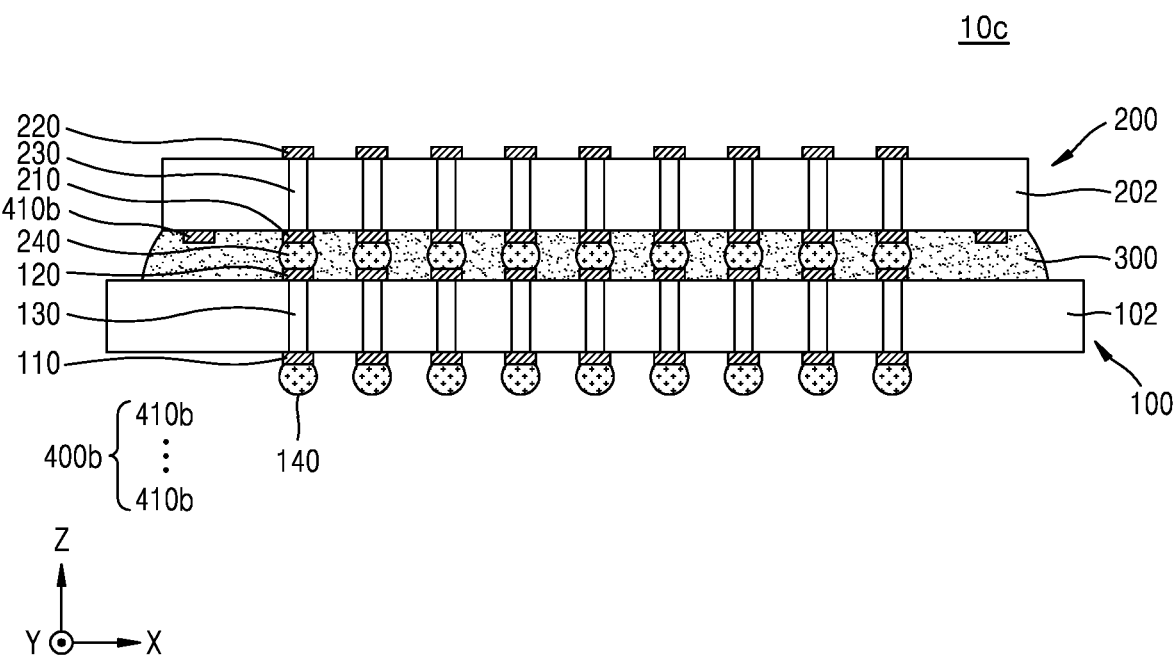

FIG. 4 is a cross-sectional view of a semiconductor package 10*c* according to an embodiment.

Referring to FIG. 4, the semiconductor package 10*c* may include the first semiconductor chip 100, the second semiconductor chip 200, the protective insulating layer 300, and the conductive structure 400*b*. The first semiconductor chip 100, the second semiconductor chip 200, and the protective insulating layer 300 in FIG. 4 may be substantially the same as those of the semiconductor package 10 of FIG. 1A. Therefore, only the conductive structure 400*b* is described below.

The conductive structure 400*b* may include a plurality of sub patterns 410*b*. The top surface of the conductive structure 400*b* and/or the top surface of each of the sub patterns 410*b* may be at substantially the same vertical level as (i.e., may be coplanar with) the topmost surface of the protective insulating layer 300 and/or the bottom surface of the second semiconductor chip 200. The bottom surface of the conductive structure 400*b* and/or the bottom surface of each of the sub patterns 410*b* may be at a lower vertical level than the topmost surface of the protective insulating layer 300 and/or the bottom surface of the second semiconductor chip 200. In other words, the bottom surface of the conductive structure 400*b* and/or the bottom surface of each of the sub patterns 410*b* may be at substantially the same vertical level as or at a lower vertical level than the topmost surface of the protective insulating layer 300 and/or the bottom surface of the second semiconductor chip 200.

According to an embodiment, the top surface of the conductive structure 400*b* and/or the top surface of each of the sub patterns 410*b* may be at a higher vertical level than the topmost surface of the protective insulating layer 300 and/or the bottom surface of the second semiconductor chip 200.

According to an embodiment, the top surface of the conductive structure 400*b* and/or the top surface of each of the sub patterns 410*b* may be at substantially the same vertical level as or at a higher vertical level than the topmost surface of the protective insulating layer 300 and/or the bottom surface of the second semiconductor chip 200.

Figure 5:
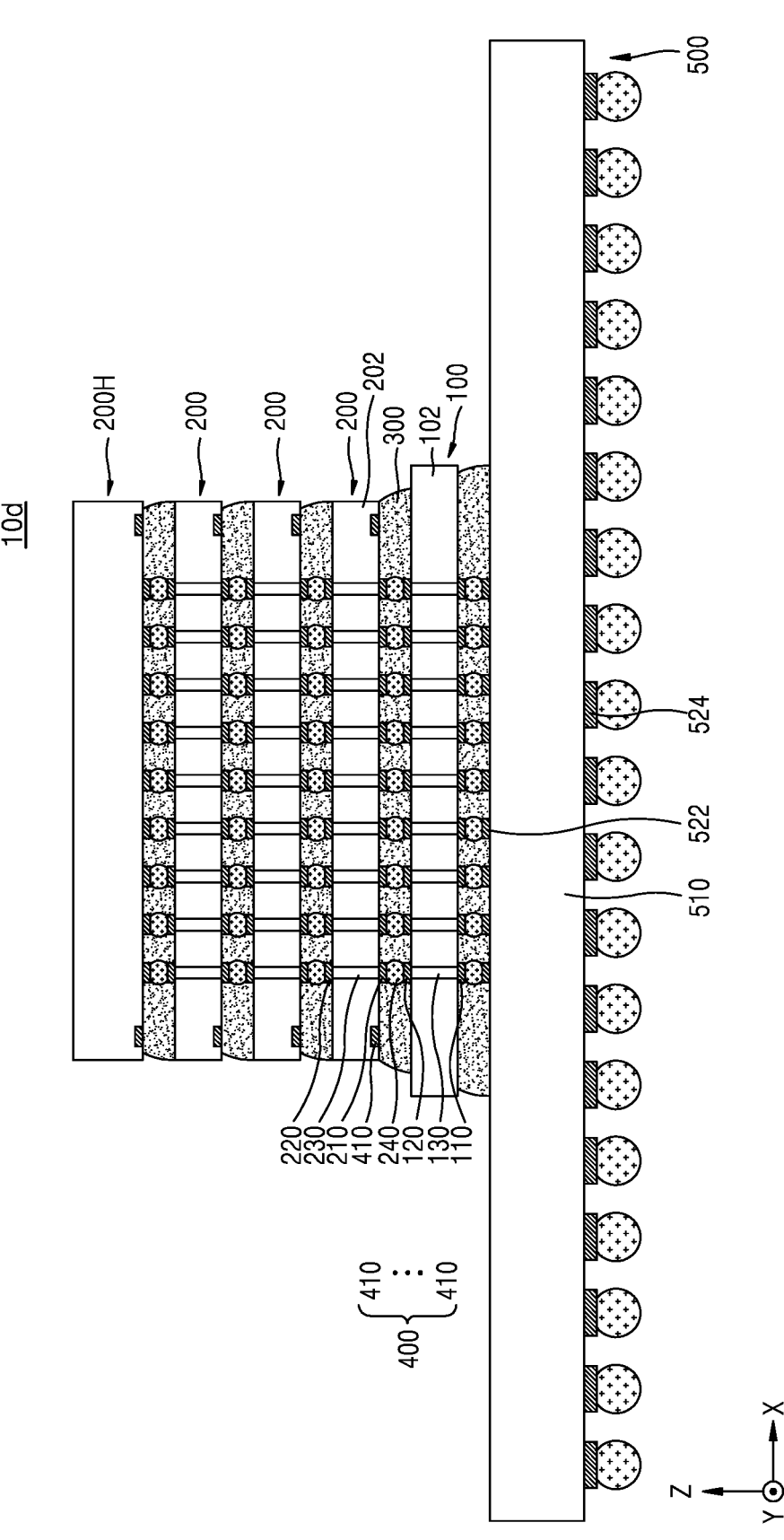

FIG. 5 is a cross-sectional view of a semiconductor package 10*d* according to an embodiment.

Referring to FIGS. 1A to 5, the semiconductor package 10*d* may include the first semiconductor chip 100, the second semiconductor chip 200, the protective insulating layer 300, the conductive structure 400, and the semiconductor package substrate 500.

The semiconductor package 10*d* may include one first semiconductor chip 100 and a plurality of second semiconductor chips 200. The second semiconductor chips 200 may be stacked on each other in the vertical direction (the Z direction). In some embodiments, the first semiconductor chip 100 may not include a memory cell for data storage. The first semiconductor chip 100 may include a test logic circuit, such as a serial-parallel conversion circuit, a design for test (DFT), Joint Test Action Group (JTAG), or a memory built-in self-test (MBIST), and/or a signal interface circuit such as PHY. The second semiconductor chips 200 may include a memory cell for data storage. For example, the first semiconductor chip 100 may correspond to a buffer chip for controlling the second semiconductor chips 200.

The second semiconductor chips 200 may include volatile memory, such as dynamic random access memory (DRAM) and static RAM (SRAM), or non-volatile memory, such as phase-change RAM (PRAM), magneto-resistive RAM (MRAM), ferroelectric RAM (FeRAM), and resistive RAM (RRAM).

In some embodiments, the first semiconductor chip 100 and the second semiconductor chips 200 may form a high bandwidth memory (HBM). For example, the first semiconductor chip 100 may correspond to a buffer chip for controlling HBM DRAM, and the second semiconductor chips 200 may correspond to a memory cell chip including memory cells of the HBM DRAM controlled by the first semiconductor chip 100. The first semiconductor chip 100 may be referred to as a buffer chip, a master chip, or an HBM controller die (i.e., an HBM controller chip). Each of the second semiconductor chips 200 may be referred to as a memory chip, a slave chip, a DRAM dice (i.e., a DRAM chip), or a DRAM slice. The first semiconductor chip 100 and the second semiconductor chips 200 stacked on the first semiconductor chip 100 may be collectively referred to as an HBM DRAM device or an HBM DRAM chip.

Although it is illustrated as an example that one semiconductor package 10*d* include four second semiconductor chips 200, one semiconductor package 10*d* may include three or at least five second semiconductor chips 200. For example, one semiconductor package 10*d* may include eight, twelve, or sixteen second semiconductor chips 200.

In some embodiments, an uppermost second semiconductor chip 200H, which is farthest away from the first semiconductor chip 100 from among the second semiconductor chips 200, may include neither the second top connection pads 220 nor the second through electrodes 230. The uppermost second semiconductor chip 200H may be thicker than the other second semiconductor chips 200.

The protective insulating layer 300 may be in contact with the first chip connection bumps 140 and/or the second chip connection bumps 240. The protective insulating layer 300 may surround the side walls of the first and/or second chip connection bumps 140 and/or 240. The protective insulating layer 300 may be between the semiconductor package substrate 500 and the first semiconductor chip 100, between the first semiconductor chip 100 and the second semiconductor chips 200, and between two adjacent second semiconductor chips 200.

The semiconductor package substrate 500 may be on the bottom surfaces of the first chip connection bumps 140 to face the bottom surface of the first semiconductor chip 100. The first semiconductor chip 100 and the second semiconductor chips 200 may be sequentially stacked on the semiconductor package substrate 500.

The semiconductor package substrate 500 may include a base board layer 510, a plurality of semiconductor package substrate top pads 522 on the top surface of the base board layer 510, and a plurality of semiconductor package substrate bottom pads 524 on the bottom surface of the base board layer 510. The semiconductor package substrate 500 may include a plurality of first wiring paths (not shown), which electrically connect the semiconductor package substrate top pads 522 to the semiconductor package substrate bottom pads 524 through the base board layer 510. In some embodiments, the semiconductor package substrate 500 may include or may be a printed circuit board (PCB). For example, the semiconductor package substrate 500 may include or may be a multi-layer PCB. In some embodiments, the semiconductor package substrate 500 may include or may be an interposer.

In some embodiments, a semiconductor package may include a 2.5-dimensional structure (2.5D) semiconductor package or a three-dimensional (3D) structure semiconductor package. In the 3D semiconductor package, distances between semiconductor chips may be reduced by vertically stacking the same or different semiconductor chips in several layers. Each of the semiconductor chips may include through electrodes, thereby reducing the time taken for data transmission to other semiconductor chips. According to the 3D semiconductor package, various kinds of semiconductor chips may be arranged or stacked on each other, and thus, the data throughput between semiconductor chips may be increased.

For example, a semiconductor package may include a plurality of semiconductor chips to form a system-in-package, in which different kinds of semiconductor chips are electrically connected to each other and operate as a single system.

Figure 6A:
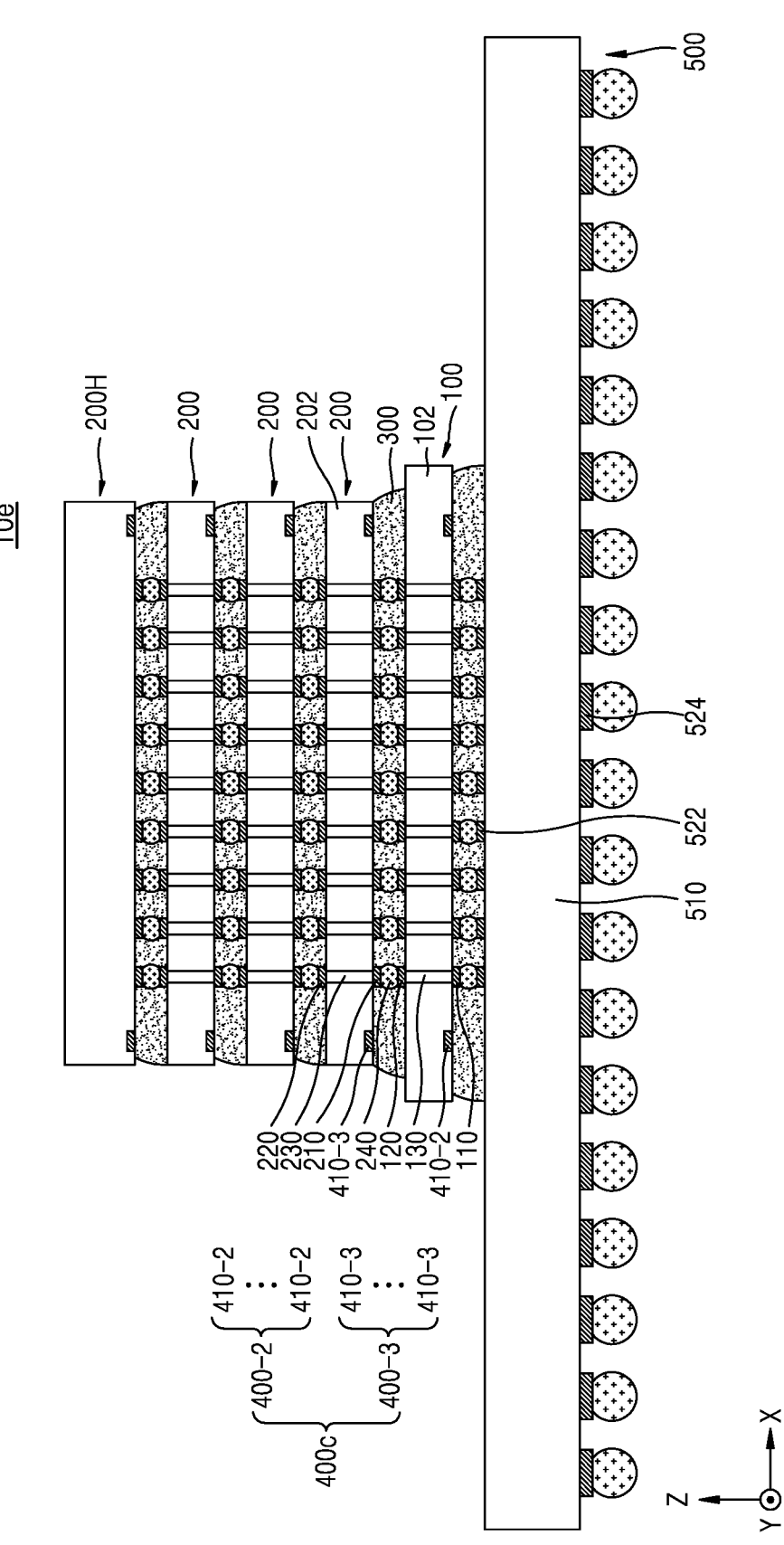
Figure 6B:
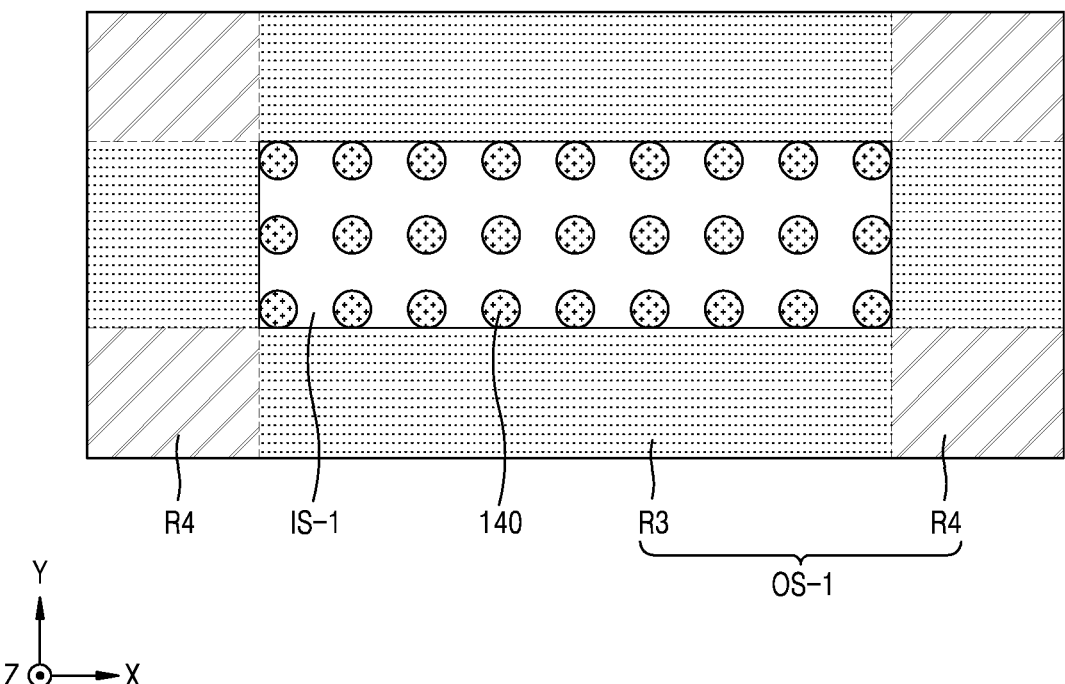
FIGS. 6B and 6C are bottom views of a first semiconductor chip according to an embodiment.
Figure 6C:
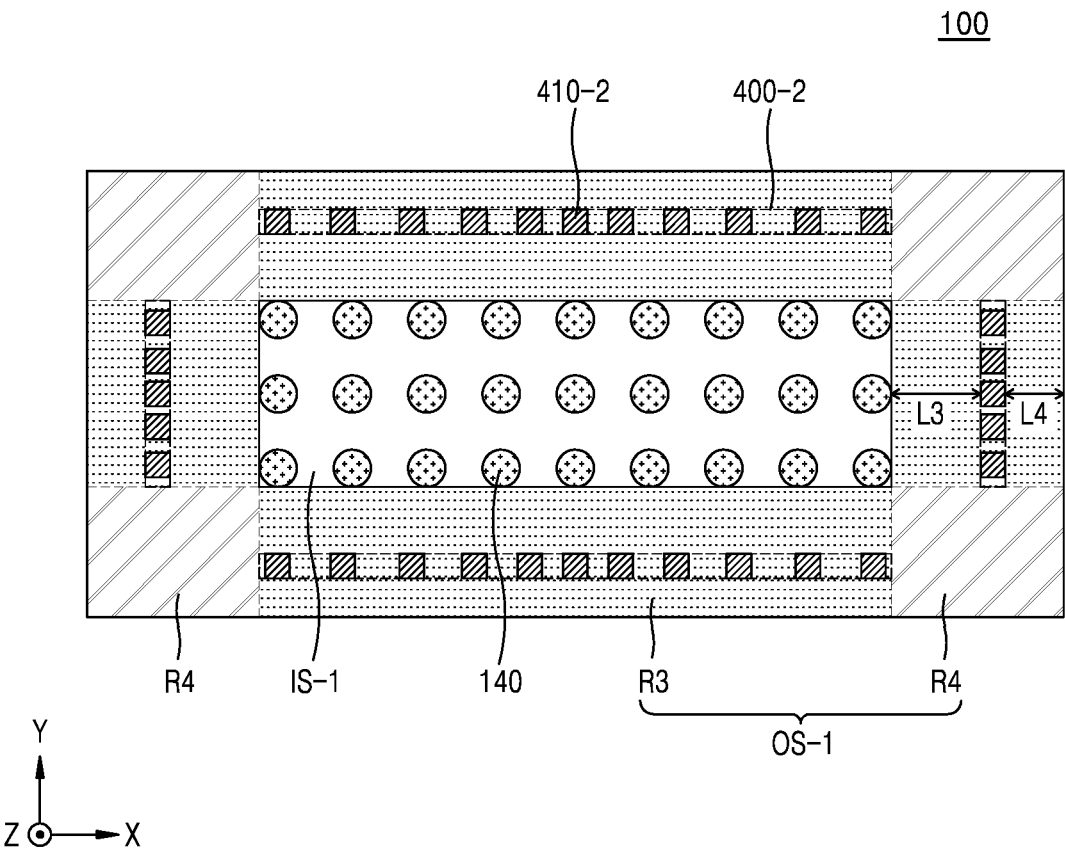

FIG. 6A is a cross-sectional view of a semiconductor package 10*e* according to an embodiment. FIG. 6B is a bottom view of the first semiconductor chip 100 of the semiconductor package 10*e*, and FIG. 6C illustrates a first conductive structure 400-2 at the bottom surface of the first semiconductor chip 100.

Referring to FIGS. 1A to 6C, the semiconductor package 10*e* may be different from the semiconductor package 10*d* of FIG. 5 in that the semiconductor package 10*e* includes a conductive structure 400*c*. Therefore, only the conductive structure 400*c* is described below.

The conductive structure 400 may include the first conductive structure 400-2 and a second conductive structure 400-3. The first conductive structure 400-2 may be at the bottom surface of the first semiconductor chip 100 and extend along an edge of the bottom surface of the first semiconductor chip 100. The first conductive structure 400-2 may include a plurality of first sub patterns 410-2. The second conductive structure 400-3 may extend along an edge of the bottom surface of each of the second semiconductor chips 200. The second conductive structure 400-3 may include a plurality of second sub patterns 410-3. The second conductive structure 400-3 may be substantially the same as the conductive structure 400 in FIG. 1A, and the second sub patterns 410-3 may be substantially the same as the sub patterns 410 in FIG. 1A.

According to an embodiment, the first sub patterns 410-2 may not be electrically connected to the first top connection pads 120, the first through electrodes 130, and/or the second chip connection bumps 240. In other words, the first sub patterns 410-2 may correspond to dummy connection pads or dummy patterns. In an embodiment, the first sub patterns 410-2 as dummy connection pads may be electrically floating. In example embodiments, the first sub patterns 410-2 may be formed simultaneously with the first bottom connection pads 110. In an embodiment, the first sub patterns 410-2 may be formed using a different process than the first bottom connection pads 110.

According to an embodiment, the top surface of the first conductive structure 400-2 may be at a higher vertical level than the bottommost surface of the first semiconductor chip 100. The bottom surface of the first conductive structure 400-2 may be at substantially the same vertical level as (i.e., may be coplanar with) the bottommost surface of the first semiconductor chip 100.

According to an embodiment, the top surface of the first conductive structure 400-2 may be at the same vertical level as (i.e., may be coplanar with) the bottommost surface of the first semiconductor chip 100. The bottom surface of the first conductive structure 400-2 may be at a lower vertical level than the bottommost surface of the first semiconductor chip 100.

According to an embodiment, the top surface of the first conductive structure 400-2 may be at the same vertical level as or at a higher vertical level than the bottommost surface of the first semiconductor chip 100. The bottom surface of the first conductive structure 400-2 may be at the same vertical level as or at a lower vertical level than the bottommost surface of the first semiconductor chip 100.

In a plan view, the first conductive structure 400-2 may be only in a first semiconductor chip outer space OS-1. The first conductive structure 400-2 may be between a first semiconductor chip inner space IS-1 of the bottom surface of the first semiconductor chip 100 and an edge of the bottom surface of the first semiconductor chip 100.

The first semiconductor chip outer space OS-1 may be divided into a third region R3 and a fourth region R4. The third region R3 may be adjacent to the center of an edge of the bottom surface of the first semiconductor chip 100, and the fourth region R4 may be adjacent to a vertex of the first semiconductor chip 100. The vertex may be a point at which two adjacent edges of the bottom surface of the first semiconductor chip 100 meet each other.

A distance L3 from the first conductive structure 400-2 to the first semiconductor chip inner space IS-1 may be greater than a distance L4 from the first conductive structure 400-2 to an edge of the first semiconductor chip 100, which is the nearest from the first conductive structure 400-2 in a direction perpendicular to an extension direction of the long axis of the first conductive structure 400-2.

In a plan view, the first sub patterns 410-2 may be separated from one another in the first horizontal direction (the X direction) and/or the second horizontal direction (the Y direction). A horizontal distance between the first sub patterns 410-2 may increase toward the fourth region R4. In other words, a gap between the first sub patterns 410-2 of the first conductive structure 400-2 may decrease toward the center of an edge of the first semiconductor chip 100 and increase toward a vertex of the first semiconductor chip 100. In an embodiment, the first sub patterns 410-2 may include a plurality of first patterns that are arranged along a first edge of the first semiconductor chip 100 extending in the X direction, and a plurality of second patterns that are arranged along a second edge of the first semiconductor chip 100 extending in the Y direction. A horizontal distance between two adjacent first patterns of the plurality first patterns may increase toward the second edge of the first semiconductor chip 100.

FIGS. 7A to 7E are cross-sectional views of stages in a method of fabricating the semiconductor package 10, according to an embodiment. FIG. 8 is a flowchart of a method of fabricating a semiconductor package, according to an embodiment. An example of the method of fabricating the semiconductor package 10 of FIG. 1A is described below with reference to FIGS. 7A to 8.

Figure 7A:
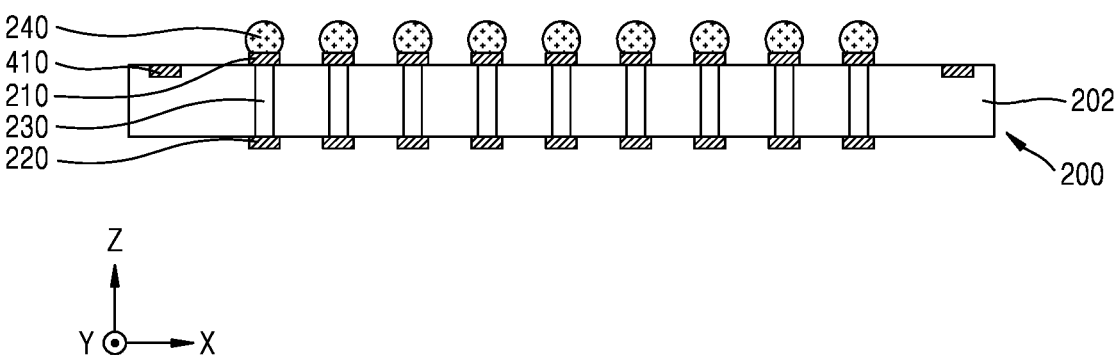
FIGS. 7A to 7E are cross-sectional views showing stages of a method of fabricating a semiconductor package, according to an embodiment.
Figure 8:
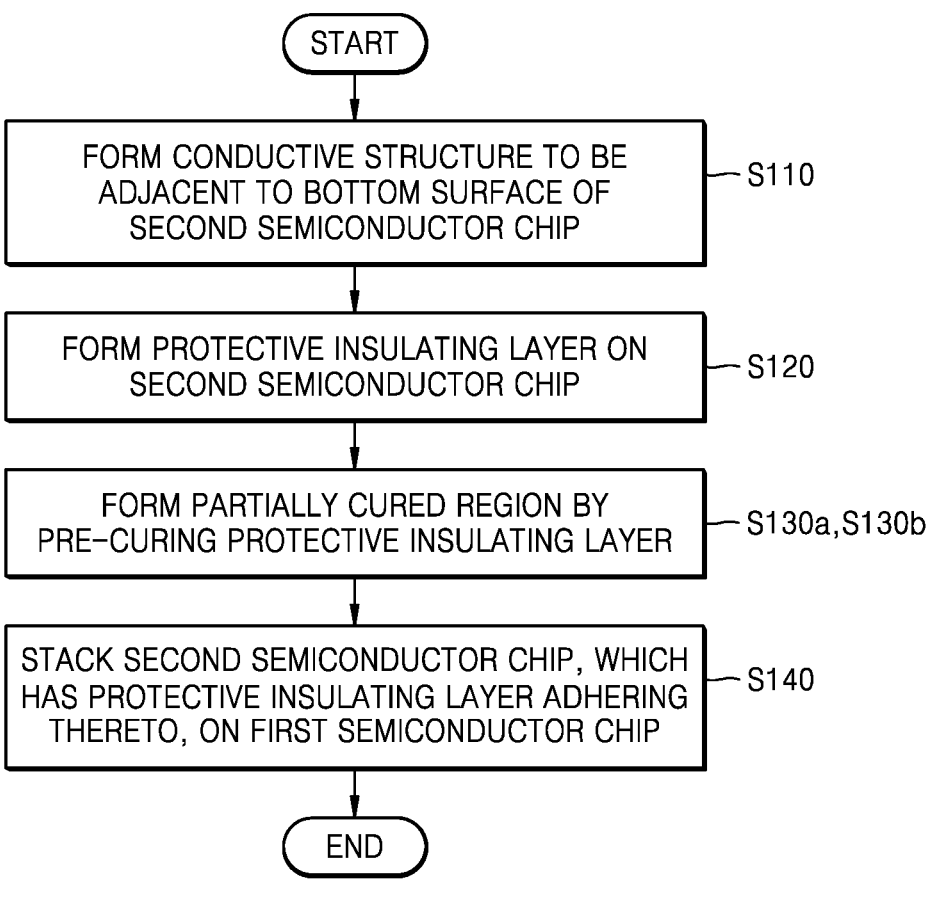
FIG. 8 is a flowchart of a method of fabricating a semiconductor package, according to an embodiment.

Referring to FIGS. 1A, 7A, and 8, the second semiconductor chip 200 may be prepared. The second semiconductor chip 200 may include a plurality of second bottom connection pads 210, a plurality of second top connection pads 220, and a plurality of second through electrodes 230. A plurality of second chip connection bumps 240 may be formed on the second semiconductor chip 200. The conductive structure 400 may be formed to be adjacent to or formed at the bottom surface of the second semiconductor chip 200 in operation S110. To form the second chip connection bumps 240 and the conductive structure 400, the bottom surface of the second semiconductor chip 200 may be at a higher vertical level than the top surface of the second semiconductor chip 200.

The conductive structure 400 may be formed to extend along an edge of the second semiconductor chip 200. The conductive structure 400 may include a plurality of sub patterns 410 arranged along the edge of the second semiconductor chip 200. According to an embodiment, the sub patterns 410 may not be electrically connected to the second bottom connection pads 210, the second through electrodes 230, and/or the second chip connection bumps 240. In other words, the sub patterns 410 may correspond to dummy connection pads or dummy patterns. In an embodiment, the sub patterns 410 as dummy patterns may be electrically floating.

As described above, the conductive structure 400 may be arranged only in the outer space OS. The distance L1 from the conductive structure 400 to the inner space IS may be greater than the distance L2 from the conductive structure 400 to an edge of the bottom surface of the second semiconductor chip 200, which is the nearest from the conductive structure 400 in the direction perpendicular to the extension direction of the long axis of the conductive structure 400.

The sub patterns 410 may be separated from one another in the first horizontal direction (the X direction) and/or the second horizontal direction (the Y direction). A horizontal distance between the sub patterns 410 may increase toward the second region R2. In other words, a gap between the sub patterns 410 of the conductive structure 400 may decrease toward the center of an edge of the second semiconductor chip 200 and increase toward a vertex of the second semiconductor chip 200. The arrangement of the sub patterns 410 in which the horizontal distance between the sub patterns

410 increases toward the second region R2 may facilitate flowing of a melted protective insulating material into the second region R2 over a bottom surface of the second semiconductor chip 200 or may facilitate uniformly flowing of a melted protective insulating material into the second region R2 over a bottom surface of the second semiconductor chip 200.

Figure 7B:
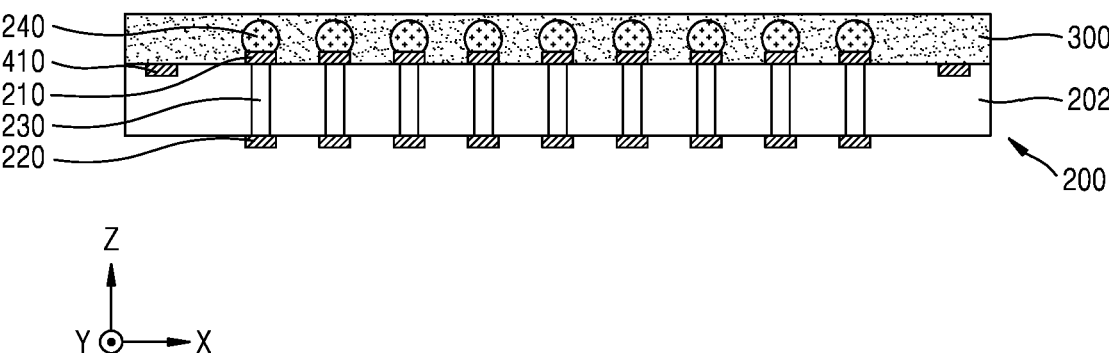

Referring to FIGS. 7B and 8, the protective insulating layer 300 may be formed on the second semiconductor chip 200 to be in contact with the second chip connection bumps 240 in operation S120. The protective insulating layer 300 may include or may be an NCF and/or a DAF.

Figure 7C:
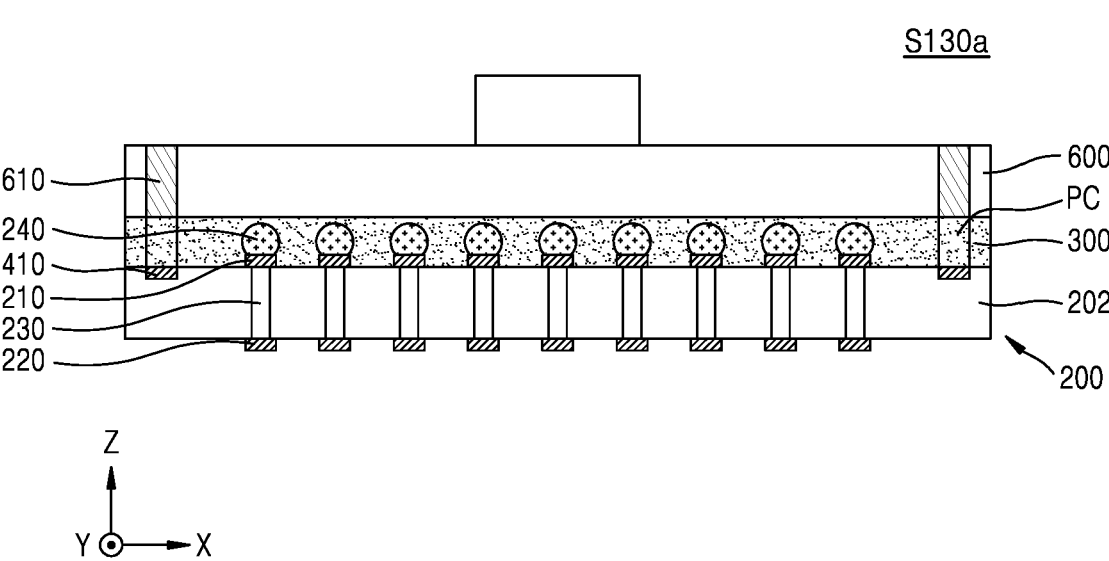

Referring to FIGS. 7C and 8, the protective insulating layer 300 may be partially pre-cured through a heat treatment in operation S130*a*. The heat treatment may be performed by a protective insulating layer curing tool 600. The protective insulating layer curing tool 600 may include a heater 610 located on the sub patterns 410. For example, the heater 610 may include an electrical resistance heater. The heater 610 may be vertically aligned with at least one of the sub patterns 410 such that the protective insulating layer 300 on the sub patterns 410 may be cured. For example, the heating temperature of the protective insulating layer 300 may be between about 50° C. and about 300° C. Accordingly, the heater 610 may be heated to a temperature between about 50° C. and about 300° C. The protective insulating layer curing tool 600 is just an example of a device that pre-cures the protective insulating layer 300. The device that pre-cures the protective insulating layer 300 is not limited thereto.

When the protective insulating layer 300 is pre-cured, the partially cured region PC may act as a dam structure. The hardness of the partially cured region PC may increase such that the protective insulating layer 300 is prevented from flowing over the first semiconductor chip 100. The partially cured region PC may adhere to the sub patterns 410 of the conductive structure 400 such that the position of the partially cured region PC may be fixed in the second semiconductor chip 200.

Figure 7D:
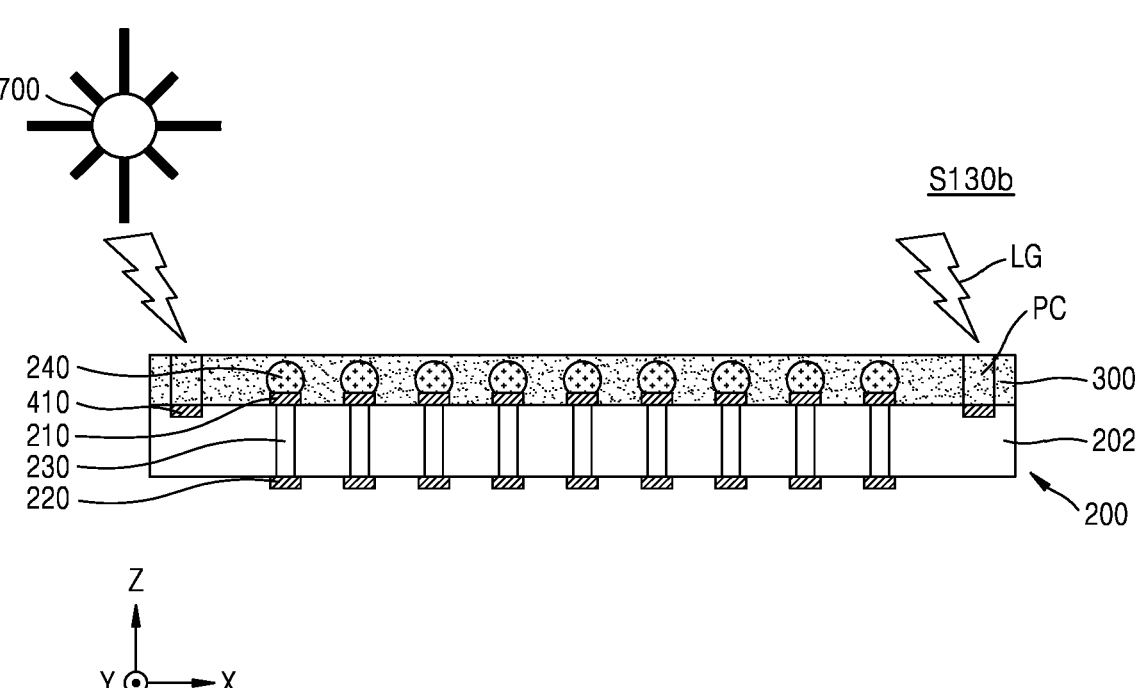

Referring to FIGS. 7D and 8, the protective insulating layer 300 may be partially pre-cured through a light treatment LG. A light source 700 may generate and output light for the light treatment LG of the protective insulating layer 300. The protective insulating layer 300 may undergo the light treatment LG via infrared rays or ultraviolet rays.

The partially cured region PC may be formed in the protective insulating layer 300 by pre-curing the protective insulating layer 300 in operation S130*b*. The partially cured region PC may have a higher hardness than another region of the protective insulating layer 300 (e.g., a portion of the protective insulating layer 300 overlapping an inner space of the second semiconductor chip 200). The partially cured region PC may overlap the sub patterns 410 of the conductive structure 400 in the second semiconductor chip 200.

Figure 7E:
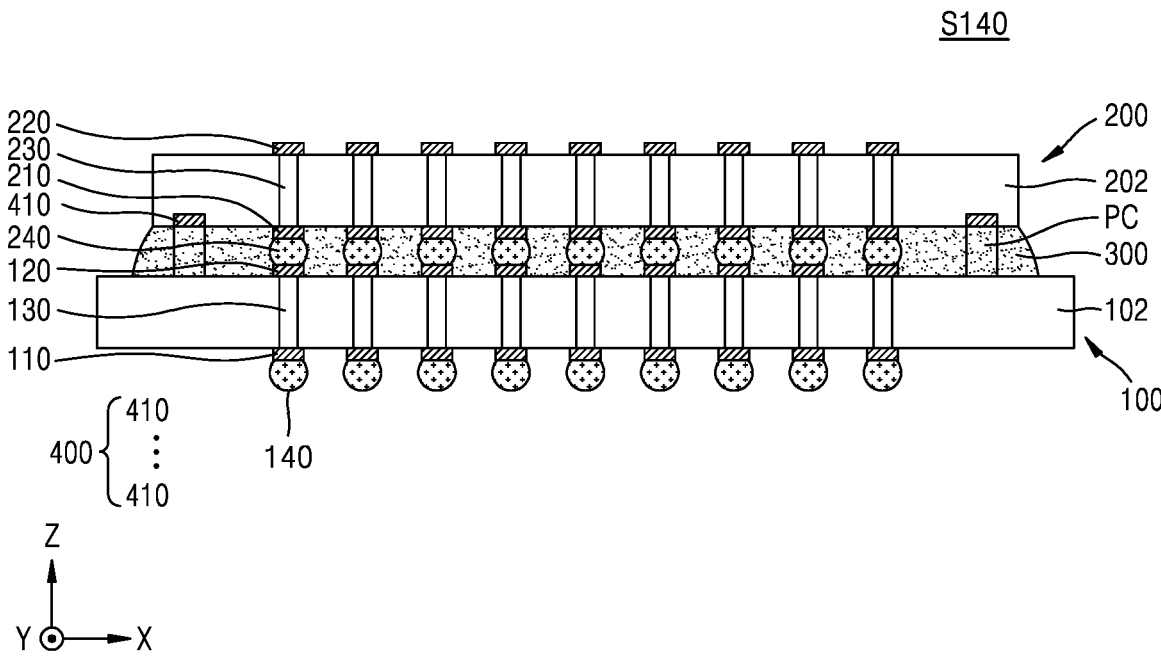

Referring to FIG. 7E together with FIGS. 7C, 7C, and 8, the second semiconductor chip 200 may be flipped over and stacked on the first semiconductor chip 100 in operation S140. In other words, the second semiconductor chip 200 may be stacked on the first semiconductor chip 100 such that the bottom surface of the second semiconductor chip 200 faces the top surface of first semiconductor chip 100.

For example, to stack the second semiconductor chip 200 on the first semiconductor chip 100, an operation of adsorbing and fixing the second semiconductor chip 200 to a bonding head (not shown), an operation of locating the second semiconductor chip 200 on the first semiconductor chip 100 by using the bonding head, and an operation of curing the protective insulating layer 300 by applying heat and pressure may be sequentially performed.

In the process of stacking the second semiconductor chip 200 on the first semiconductor chip 100, the protective insulating layer 300 may be melted by heat and pressure and flow outwards to a region of the first semiconductor chip 100. When the protective insulating layer 300 flows, the partially cured region PC may function as a dam structure that stops the flow of the protective insulating layer 300. Accordingly, the fluidity of the protective insulating layer 300 may be reduced in a region in which the partially cured region PC is arranged (i.e., a region adjacent to the center of the bottom surface of the second semiconductor chip 200) such that the protective insulating layer 300 may be prevented or suppressed from flowing toward the first semiconductor chip 100.

Without the partially cured region PC serving as a dam, a protective insulating layer may flow over a first semiconductor chip in the process of stacking a second semiconductor chip on the first semiconductor chip, and thus a gap may be formed between two semiconductor chips stacked on each other. The protective insulating layer may not completely cover connection bumps between the two semiconductor chips and may expose the connection bumps to the outside. Accordingly, the reliability of semiconductor packages may be relatively low. In addition, the protective insulating layer may not cover a region that is adjacent to a vertex of the top surface of the first semiconductor chip. Accordingly, the protective insulating layer may not entirely cover the top surface of the first semiconductor chip, and therefore, the reliability of semiconductor packages may be relatively low.

According to an embodiment, the semiconductor package 10 includes the conductive structure 400, thereby preventing or suppressing the protective insulating layer 300 from flowing to the top surface of the first semiconductor chip 100. Accordingly, the reliability of the semiconductor package 10 may be increased. In addition, because the sub patterns 410 are arranged only in the first region R1, but not in the second region R2, the protective insulating layer 300 may entirely cover the top surface of the first semiconductor chip 100. For example, the sub patterns 410 are arranged to be adjacent to the center of an edge of the bottom surface of the second semiconductor chip 200, and the overflow amount of the protective insulating layer 300 in the first region R1 decreases and the overflow amount of the protective insulating layer 300 in the second region R2 increases. Accordingly, the protective insulating layer 300 may entirely cover the top surface of the first semiconductor chip 100. The horizontal distance between the sub patterns 410 may increase toward the second region R2 to increase the reliability of the semiconductor package 10. In an embodiment, the sub patterns 410 may be formed of a conductive material such as metal to which the partially cured region PC of the protective insulating layer 300 may adhere.

While the inventive concept has been particularly shown and described with reference to embodiments thereof, it will be understood that various changes in form and details may be made therein without departing from the spirit and scope of the following claims.

What is claimed is:
1. A semiconductor package comprising:
   a first semiconductor chip;
   a second semiconductor chip on the first semiconductor chip;

a plurality of chip connection bumps between the first semiconductor chip and the second semiconductor chip;

a protective insulating layer between the first semiconductor chip and the second semiconductor chip, the protective insulating layer contacting the plurality of chip connection bumps; and a first dummy conductive structure at a bottom surface of the second semiconductor chip, wherein when viewed in a plan view, the first dummy conductive structure surrounds an outer boundary of a region where the plurality of chip connection bumps are disposed, wherein the bottom surface of the second semiconductor chip faces the first semiconductor chip, wherein the first dummy conductive structure includes a plurality of dummy patterns separated from each other, and the plurality of dummy patterns are arranged along an edge of the second semiconductor chip, wherein the plurality of dummy patterns include:

a plurality of first dummy patterns that are arranged along a first straight line extending in a first horizontal direction and are separated from each other in the first horizontal direction, and a plurality of second dummy patterns that are arranged along a second straight line extending in a second horizontal direction separated from each other in the second horizontal direction different from the first horizontal direction, and wherein a distance of two adjacent first dummy patterns of the plurality of first dummy patterns increases toward a crossing point where the first straight line and the second straight line meets.

2. The semiconductor package of claim 1, wherein at the crossing point, neither one of the plurality of first dummy patterns nor one of the plurality of second dummy patterns is disposed.

3. The semiconductor package of claim 1, wherein a top surface of the first dummy conductive structure is at a higher vertical level than a bottommost surface of the second semiconductor chip.

4. The semiconductor package of claim 1, wherein a bottom surface of the first dummy conductive structure, a topmost surface of the protective insulating layer, and the bottom surface of the second semiconductor chip are at substantially a same vertical level as one another.

5. The semiconductor package of claim 1, wherein a top surface of the first dummy conductive structure, a topmost surface of the protective insulating layer, and the bottom surface of the second semiconductor chip are at substantially a same vertical level as one another.

6. The semiconductor package of claim 1, further comprising:

a second dummy conductive structure inside the first semiconductor chip and disposed at a top surface of the first semiconductor chip, wherein the second dummy conductive structure is at an outer top surface of the top surface of the first semiconductor chip when viewed in the plan view, wherein the second dummy conductive structure includes a plurality of third dummy patterns, and wherein each third dummy pattern of the plurality of third dummy patterns overlaps a corresponding first dummy pattern of the plurality of first dummy patterns in a vertical direction.

7. The semiconductor package of claim 1, wherein the protective insulating layer includes a nonconductive film (NCF) or a die attach film (DAF).

8. A semiconductor package comprising:

a semiconductor package substrate;

a first semiconductor chip on the semiconductor package substrate;

a plurality of second semiconductor chips stacked on the first semiconductor chip;

a plurality of first chip connection bumps between the semiconductor package substrate and the first semiconductor chip;

a plurality of second chip connection bumps between the first semiconductor chip and a bottommost second semiconductor chip of the plurality of second semiconductor chips or between two adjacent second semiconductor chips of the plurality of second semiconductor chips;

a protective insulating layer between the semiconductor package substrate and the first semiconductor chip, the first semiconductor chip and the bottommost second semiconductor chip, or between the two adjacent second semiconductor chips, the protective insulating layer contacting the plurality of first chip connection bumps or the plurality of second chip connection bumps; and a first dummy conductive structure at a bottom surface of each second semiconductor chip of the plurality of second semiconductor chips, wherein when viewed in a plan view, the first dummy conductive structure surrounds an outer boundary of a region where the plurality of second chip connection bumps are disposed, wherein the bottom surface of each second semiconductor chip of the plurality of second semiconductor chips faces the first semiconductor chip, wherein the first dummy conductive structure includes a plurality of first dummy patterns arranged along an edge of each second semiconductor chip of the plurality of second semiconductor chips, and wherein the plurality of first dummy patterns are separated from each other, wherein, when viewed in the plan view, each of the plurality of second semiconductor chips includes an outer space surrounding the outer boundary of the region where the plurality of second chip connection bumps, wherein the outer space includes a first region adjacent to a center of the edge of each second semiconductor chip of the plurality of second semiconductor chips, and a second region adjacent to a vertex of each of the plurality of second semiconductor chips, and wherein a horizontal distance between two adjacent first dummy patterns of the plurality of first dummy patterns increases toward the second region.

9. The semiconductor package of claim 8, wherein, when viewed in the plan view, a horizontal distance from the first dummy conductive structure to the outer boundary is greater than a horizontal distance from the first dummy conductive structure to a nearest edge of each second semiconductor chip of the plurality of second semiconductor chips in a direction that is perpendicular to an extension direction of a long axis of the first dummy conductive structure.

10. The semiconductor package of claim 8, further comprising:

a second dummy conductive structure at a bottom surface of the first semiconductor chip, the bottom surface of the first semiconductor chip facing the semiconductor package substrate, wherein the second dummy conductive structure include a plurality of second dummy patterns, and wherein, when viewed in the plan view, the plurality of second dummy patterns surround an outer boundary of a region where the plurality of first chip connection bumps are disposed, and the plurality of second dummy patterns are arranged along an edge of the first semiconductor chip.

11. The semiconductor package of claim 8, wherein the first dummy conductive structure is arranged only in the first region.

12. The semiconductor package of claim 8, wherein a horizontal width of each of the plurality of first dummy patterns is between about 25 micrometers and about 45 micrometers.

13. The semiconductor package of claim 8, wherein the first semiconductor chip corresponds to a buffer chip configured to control the plurality of second semiconductor chips, and wherein each of the plurality of second semiconductor chips corresponds to a memory chip.

14. A method of fabricating a semiconductor package, the method comprising:

arranging a plurality of chip connection bumps on a bottom surface of a second semiconductor chip, the second semiconductor chip including a top surface and the bottom surface;

forming a dummy conductive structure at the bottom surface of the second semiconductor chip, wherein the dummy conductive structure includes a plurality of dummy patterns separated from each other;

forming a protective insulating layer on the bottom surface of the second semiconductor chip, the protective insulating layer adhering to the plurality of chip connection bumps;

stacking the second semiconductor chip on a first semiconductor chip, the first semiconductor chip facing the bottom surface of the second semiconductor chip; and pre-curing a portion of the protective insulating layer, the portion of the protective insulating layer overlapping the plurality of dummy patterns in a vertical direction, wherein the bottom surface of the second semiconductor chip includes, when viewed in a plan view:

an inner bottom surface that the plurality of chip connection bumps contact, and an outer bottom surface surrounding the inner bottom surface, wherein the dummy conductive structure is at the outer bottom surface of the bottom surface of the second semiconductor chip, and wherein the plurality of dummy patterns are arranged along an edge of the bottom surface of the second semiconductor chip.

15. The method of claim 14, wherein the pre-curing of the portion of the protective insulating layer includes performing a heat treatment or a light treatment on the portion of the protective insulating layer.

16. The method of claim 15, wherein, when the portion of the protective insulating layer is pre-cured by the heat treatment, the portion of the protective insulating layer is cured by a heater.

17. The method of claim 16, wherein the heater is aligned with at least one of the plurality of dummy patterns in the vertical direction.

18. The method of claim 14, wherein, when viewed in the plan view, the outer bottom surface includes a first region adjacent to a center of the edge of the second semiconductor chip and a second region adjacent to a vertex of the second semiconductor chip, wherein the vertex is formed by two adjacent edges of the second semiconductor chip meeting each other, and wherein the portion of the protective insulating layer that is pre-cured is only in the first region.

* * * * *